United States Patent [19]

Mayer et al.

[11] 4,357,100
[45] Nov. 2, 1982

[54] ARRANGEMENT FOR PROJECTION COPYING MASKS ON TO A WORK PIECE

[75] Inventors: Herbert E. Mayer; Ernst W. Löbach, both of Eschen, Liechtenstein

[73] Assignee: Censor Patent- und Versuchs-Anstalt, Vaduz, Liechtenstein

[21] Appl. No.: 109,169

[22] Filed: Jan. 2, 1980

[30] Foreign Application Priority Data

Jan. 11, 1979 [DE] Fed. Rep. of Germany ....... 2900921

[51] Int. Cl.³ ............................................. G03B 27/52
[52] U.S. Cl. ....................................... 355/62; 355/43; 355/77; 356/152
[58] Field of Search ...................... 355/43, 62, 63, 45, 355/77; 356/138, 152, 153

[56] References Cited

U.S. PATENT DOCUMENTS 3,695,758 10/1972 Tanaka .................................. 355/71
3,844,655 10/1974 Johannsmeier ...................... 355/43
3,865,483 2/1975 Wojcik ................................. 355/43

FOREIGN PATENT DOCUMENTS 2539206 3/1977 Fed. Rep. of Germany.
2707477 9/1977 Fed. Rep. of Germany.
2900921 6/1981 Fed. Rep. of Germany.

Primary Examiner—Richard A. Wintercorn
Attorney, Agent, or Firm—Karl F. Ross

[57] ABSTRACT

An arrangement for projection copying of masks onto a workpiece, in particular onto a semiconductor substrate for producing integrated circuits, wherein the images of the patterns of the masks are formed by a projection lens on a photosensitive layer on the workpiece. The projection lens is completely corrected at the exposure wavelength used, and alignment patterns of the mask are aligned relative to adjustment marks on the workpiece, after images of the alignment pattern and the adjustment mark have been formed in the same plane, with adjustment exposure, by the projection lens and possibly an auxiliary optical means. The formation of the images of the adjustment marks in the plane of the alignment pattern or the alignment pattern in the plane of the adjustment marks is effected by means of the projection lens and possibly the auxiliary optical means, with an image defect which changes points to lines extending sagittally or meridionally with respect to the optical axis, and that the adjustment marks and the alignment pattern include lines which correspondingly extend sagittally and meridionally respectively with respect to the optical axis.

3 Claims, 10 Drawing Figures

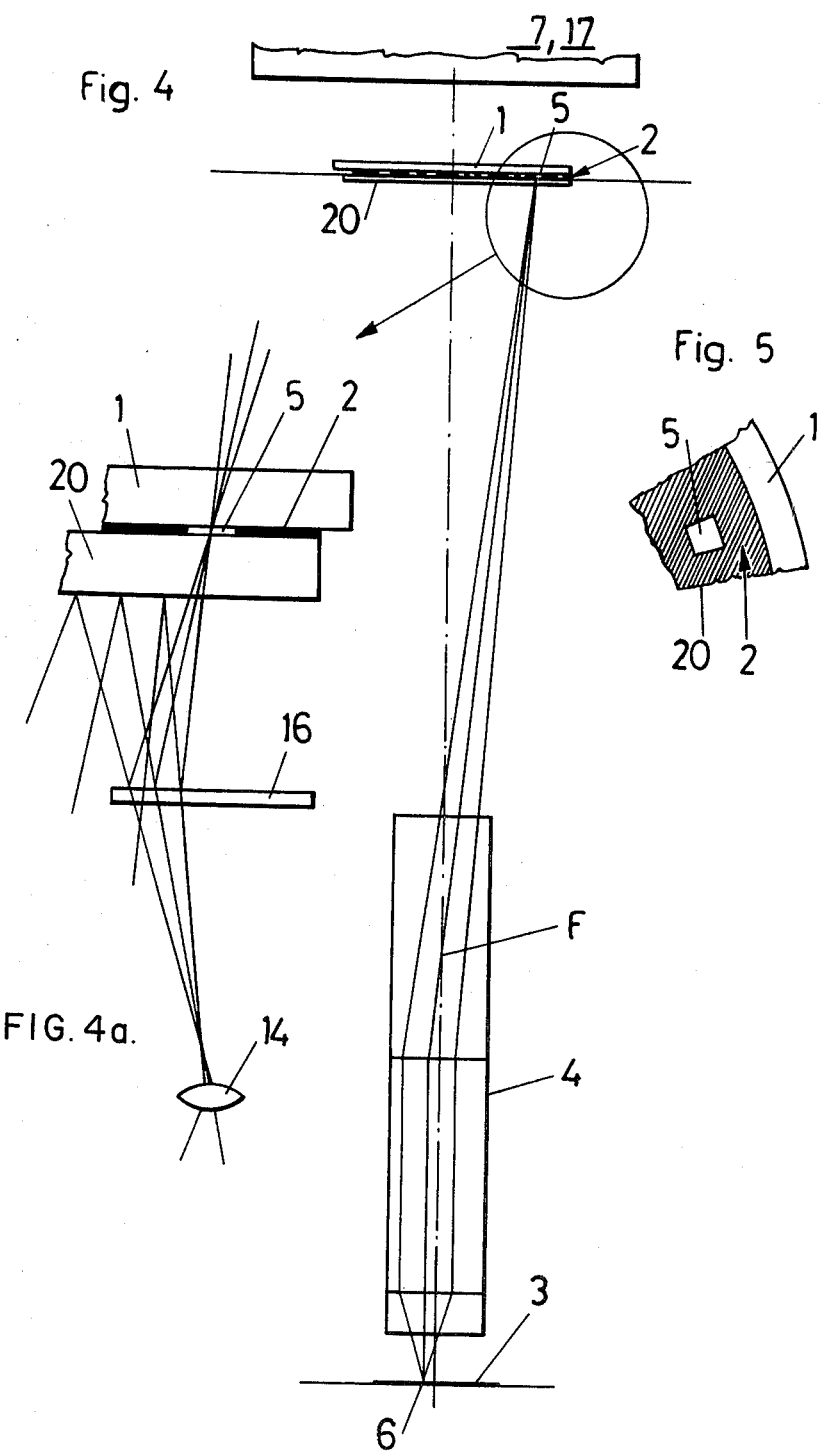

ARRANGEMENT FOR PROJECTION COPYING MASKS ON TO A WORK PIECE

FIELD OF THE INVENTION

The invention relates to an arrangement for the projection copying masks (patterns) onto a workpiece, in particular onto a semiconductor substrate for producing integrated circuits, whereby the images of the patterns of the mask are formed by a projection lens on a photosensitive layer on the workpiece, the projection lens is completely corrected at the exposure wavelength used, and alignment patterns of the mask are aligned relative to adjustment marks provided on the workpiece, after images of the alignment pattern and the adjustment mark have been formed, with adjustment exposure, by means of the projection lens and possibly an auxiliary optical means, in the same plane.

BACKGROUND OF THE INVENTION

It is absolutely essential for the position of the substrate to be precisely related to the position of the mask, particularly when the substrate has already been provided with circuit components or patterns, by means of one or more preceding exposure operations. In these circumstances, it is not sufficient for the substrate to be moved into a position defined by abutment means, and to be moved by predetermined increments, but, it is necessary to provide for direct monitoring of the position which has actually been reached, and to provide the possibility of suitable correction. This monitoring operation is effected by images of adjustment marks on the substrate and an alignment pattern on the mask formed in the same plane, and by checking the relative association thereof. Usually, this image projection operation is effected in the plane of the projection mask. Because of the reversability of the optical beam, forming an image of the alignment pattern on the mask in the plane of the substrate, in which the comparison of positions required for the adjustment operation can also be effected, will always correspond to the above-mentioned formation of images of the alignment pattern and the adjustment marks in the same plane.

If, in an arrangement of this kind, the adjustment operation is carried out with the same wavelength as the exposure operation, correction in respect of the projection lens for this wavelength also provides the necessary accuracy in forming the image of the mask of the substrate and the adjustment mark regions of the mask and the substrate in each other.

However, the amount of light which falls onto the light-sensitive layer during the adjustment operation may not exceed a given value (about 1% of the exposure light). This process is known for example from DOS No. 27 07 477 or DOS No. 25 39 206, page 6, paragraph 3. A disadvantage with this process is the weakness of the signal which is available for the adjustment operation and which increases the difficulty of and the time required for the adjusting operation. Usually therefore, adjustment on the one hand and subsequent exposure on the other hand are effected by two different wavelengths of light, the adjustment wavelength and the exposure wavelength, so that there is no erratic preliminary exposure of the photosensitive lacquer which is sensitive only to the exposure wavelength, during the adjustment operation.

Moreover, the projection lens must project the mask sharply onto the substrate, at the exposure wavelength and, at the adjustment wavelength, the projection lens must project the alignment pattern of the mask sharply onto the adjustment mark region of the substrate and/or vice-versa. This would be readily possible with a projection lens which is corrected both at the adjustment wavelength and also the exposure wavelength. In that case, the plane of the mask and the plane of the substrate, in which planes the alignment patterns and the adjustment marks respectively lie, are combined together at both wavelengths and are identical for both wavelengths. For this reason, the notional separation between forming the image of the actual mask and of its alignment pattern is also unnecessary in this respect, and is also not usually done. The main disadvantage of this arrangement was that a diffraction-limited higher-power lens with a very high numerical aperture and a large image field could hitherto only be corrected at one wavelength and can therefore not be used in this process.

In a piece of equipment which was produced some time ago, an auxiliary lens was added to the equipment for the purposes of adjustment of the projection lens proper, the auxiliary lens causing correction at the adjustment wavelength. The disadvantage of this process is that the auxiliary lens must be pivoted into and out of the path of the beam, and this causes time to be lost, gives rise to vibration and requires an expensive mechanism.

SUMMARY OF THE INVENTION

In comparison with this art, the invention is based recognition of the fact that the requirement for a sharp image of the actual pattern of the mask on the substrate and the requirement for a sharp image of the alignment pattern of the mask and the adjustment marks on the substrate in each other do not have to be interpreted in the same manner. In fact, only the position of an adjustment line in relation to the direction perpendicular thereto is utilised as information for adjustment purposes, and it is only in that direction that a sharp image of the line is required. Thus, the accuracy of the adjustment operation does not suffer from lack of sharpness of the image, which is perceptible only in the longitudinal direction of the line portion of which the image is formed.

Accordingly, the invention combines perfect image formation at the exposure wavelength, that is to say, the formation of an image wherein the geometrical-optical errors are of lesser significance than diffraction effects, with deliberate acceptance of imcomplete correction of the system which forms images of the alignment pattern and the adjusting marks in each other. These errors may not be random image-formation errors, but experience has shown that it is precisely image-formation errors which, in the manner of astigmatism, change points to lines extending sagittally or meridionally with respect to the optical axis, that are the most difficult to correct, for the adjustment wavelength, in addition to the correction which is already made in any case, with respect to the projection lens, at the exposure wavelength. However, it is precisely this image-formation error which can now remain if lines in the alignment pattern to be projected, which are used for the adjustment operation, and the adjustment mark to be projected, extend sagittally and meridionally respectively, in accordance with the image-formation error present. In this case, such error only results in a lack of sharpness in the end region of the line which is of no importance for the adjustment operation.

BRIEF DESCRIPTION OF THE DRAWING

Further features of the invention are described hereinafter with reference to the drawing, in which:

FIG. 4 is a diagrammatic elevational view of a further embodiment, and FIG. 4A shows a detail of the region IVA of this embodiment drawn to a larger scale, FIG. 5 diagrammatically shows the associated alignment pattern.

SPECIFIC DESCRIPTION

Figures 1, 1A:
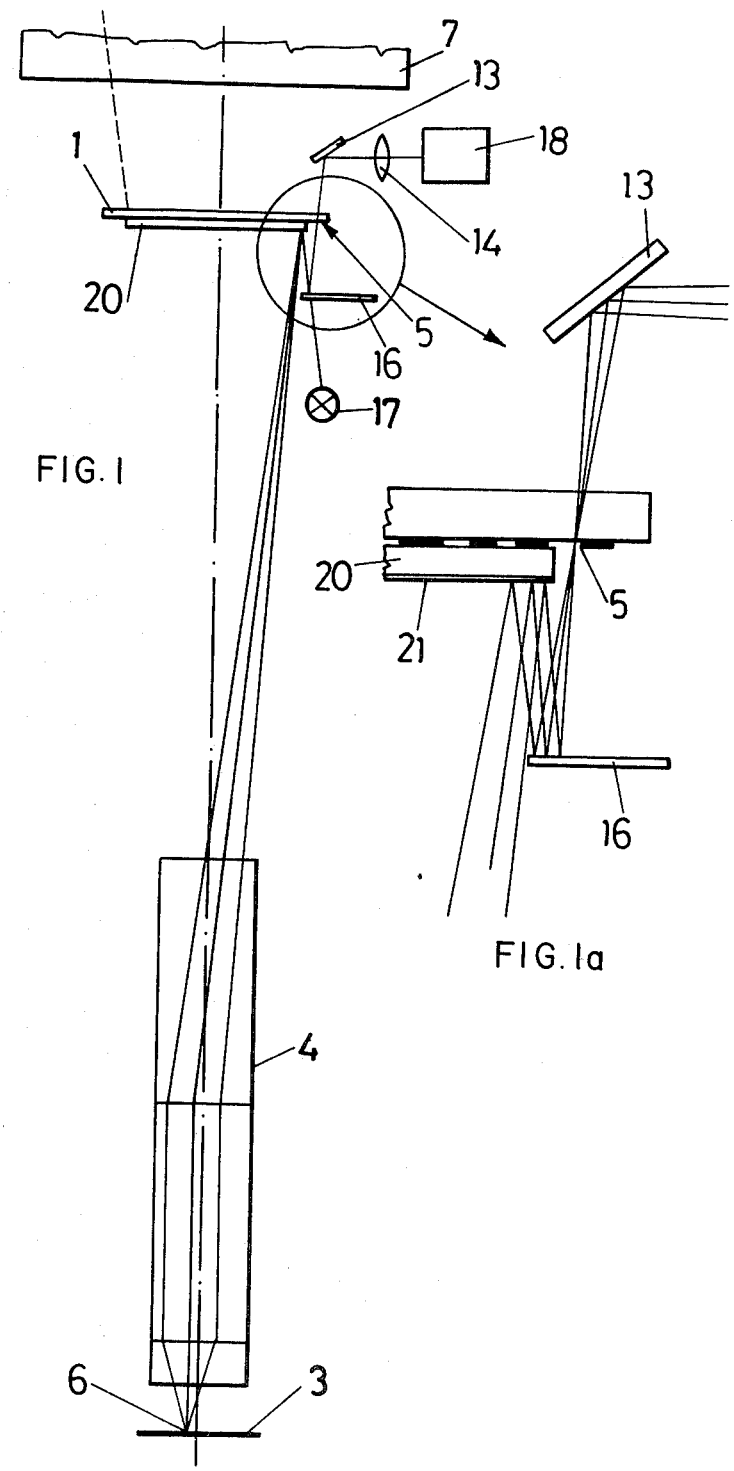
FIG. 1 is a diagrammatic elevational view of the arrangement according to the invention.
FIG. 1A is a detail view of the region IA of FIG. 1 drawn to a larger scale.

FIG. 1 shows a projection exposure device having a projection lens 4 of focal length F, which, upon exposure of the mask layer 2 provided on a support glass 1, forms an image thereof on the surface of a semiconductor 3 which is coated with photosensitive lacquer. The means 7 for exposure of the projection mask has nothing to do with the present invention and is not shown in greater detail herein for that reason.

For the purposes of precise setting of the relative position of the mask 2 and the substrate (semiconductor 3), alignment patterns 5 are provided in a light-transmissive region of the mask 2. When adjustment marks 6 provided on the substrate 3 are exposed by a means 17 which emits light at the adjustment wavelength which is different from the exposure wavelength, the adjustment marks 6 are projected into the plane of the adjustment patterns 5 where it is possible to judge the correctness of the positioning, with reference to the position of the adjustment marks relative to the alignment patterns 5.

The mask 2 is sealed with a protective glass 20. Provided on the free surface of the protective glass 20 is a light splitter layer 21 which is substantially transmissive in respect of the exposure wavelength (for example $\lambda = 436$ nm), but which reflects the adjustment wavelength (for example $\lambda = 547$ nm).

The light produced by the adjustment light source 17 passes partly through a semi-transparent mirror 16 and is projected by the light splitter layer 21 on the protective glass 20 through the projection lens 4 on to the adjustment mark 6 on the substrate 9.

By means of this light, the image of the adjustment mark 6 is now formed, by way of the projection lens 4, the light splitter mirror 21 and the semi-transparent mirror 16, in the region of the alignment pattern 5 of the mask 2. The images of the marks on the substrate and the mask are now simultaneously projected by way of a further deflection mirror 13 and an optical objective means 14 onto the photoelectric evaluation means 18.

A particular feature in this embodiment is the increase in length of the beam path in the adjustment light. This increase in length compensates for part of the image-formation errors which are caused by the transition from the exposure wavelength to the adjustment wavelength.

Figure 2:
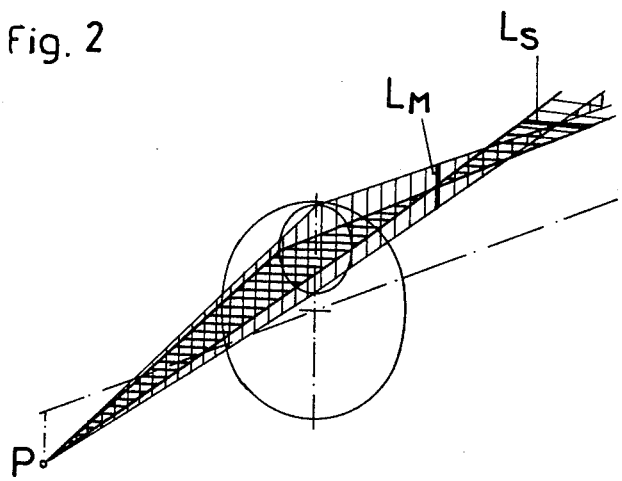
FIG. 2 shows the path of the beam of a system with the image-formation errors which are permissible when forming the images of the adjustment marks and the alignment pattern.

The invention provides that, when the adjustment marks 6 are illuminated with light of the adjustment wavelength which does not influence the surface of the substrate 3, which surface is sensitive in itself, the adjustment marks 6 are projected into the plane of the alignment pattern 5, with only one image defect of error. The nature of this defect is shown in FIG. 2, which shows, by reference to an example of normal astigmatism, how a point P is converted in the sagittal focal plane to a meridionally (radially) extending line $L_M$ and in the meridional focal plane to a sagittally (peripherally) extending line $L_S$. With the lenses which are actually to be employed for carrying out the invention, the conditions are somewhat more complicated only insofar as therein the normal astigmatism is also substantially corrected, as a third-order image defect, also in respect of the adjustment wavelength. However, the only essential point in relation to the invention is that the remaining image defect has an effect of the kind illustrated, that is to say, converts the beam emitted from a point into a line which extends meridionally or sagittally with respect to the optical axis.

Figure 3A:
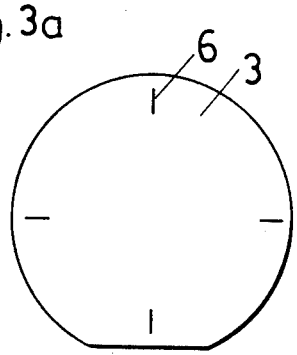
FIGS. 3a to 3d show the orientation of the adjustment marks, in accordance with the invention.
Figure 3C:
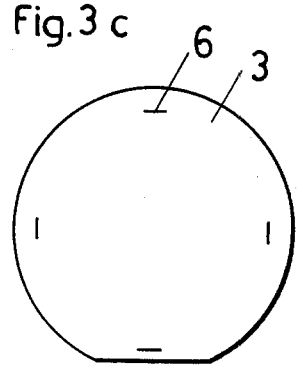
Figure 3B:
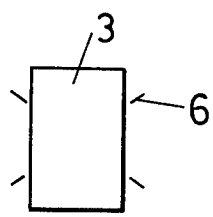

If the image defect which is permitted and in fact provided in accordance with the invention changes the beam issuing from point P into a meridionally (radially) extending line portion $L_M$, it also reconverts a line portion extending meridionally with respect to the optical axis, thereinto. The image defect only results in a lack of sharpness in the end regions of the line portion, and such lack of sharpness does not cause any further difficulty from the point of view of adjustment purposes. Meridionally extending adjustment marks 6 of this kind are shown in FIGS. 3a and 3b. In FIG. 3a, they are associated with the entire semiconductor wafer, while FIG. 3b relates to a situation in which a semiconductor wafer 3 is subdivided into individual portions (chips) 3' which are exposed in stepwise succession. In this case, associated with each individual surface are adjustment marks 6 which are aligned to the centerpoint of that surface, which centerpoint is moved into the optical axis in the exposure operation.

Figure 3D:
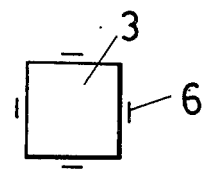

The conditions obtaining are similar if the image defect provided in the system which projects the adjustment marks 6 into the plane of the alignment pattern 5 projects the beams from a point into a sagittal line portion. In this case, the adjustment marks 6 are also to be arranged sagittally, with reference to the optical axis, as shown in FIGS. 3c and 3d.

In the embodiment shown in FIG. 4, the conditions are somewhat different insofar as the means 17 for providing the adjustment light is above the mask 2. The image of the alignment pattern 5 is projected on to the substrate 3 by the adjustment light by way of the semi-transparent mirror 16 and the projection lens 4, and is there brought into a condition of alignment with the adjustment marks 6 provided on the substrate. In this arrangement, proper relative positioning of the alignment pattern 5 and the adjustment marks 6 can be defined in the usual manner in that an adjustment mark 6 should lie centrally in the rectangular spot which represents the image of the alignment pattern 5.

The marks whose images are formed one upon the other in the plane of the substrate are observed in the present case again by means of the projection lens 4, while in this embodiment the beams which are projected on to the mirror 16 by the protective glass 20 or by the mirroring thereon (not shown) are observed behind the mirror 16 by way of the optical means 14, so far as such beams pass through that mirror.

Depending on the particular nature of correction of the projection lens 4 at the adjustment wavelength, the sagittally or meridionally extending boundary lines of the alignment pattern 5 shown in FIG. 5 are used for comparison with the adjustment marks 6 which more desirably extend parallel thereto.

What is claimed is:

1. In an apparatus for the projection copying of an image of a mask onto a workpiece, the mask having an alignment pattern of marks at a surface thereof, said workpiece having adjustment marks on a surface thereof provided with a photosensitive layer, a beam of exposure, electromagnetic radiation passing through said mask and a projection lens along an optical axis thereof onto said workpiece, said lens being completely corrected at the wavelength of said exposure electromagnetic radiation, the improvement which comprises:

means for the adjustment exposure of the marks at one of said surfaces; and means including said lens and a path formed with a stigmatic defect changing an object point to a line image extending with selectively a sagittal and a meridional orientation with respect to said optical axis for projecting the adjustment-exposed marks onto a plane coplanar with the other of said surfaces for positioning of the projected images of said marks relative to the marks on said other of said surfaces, and wherein:

said marks of said surfaces include lines which extend with the same orientation pattern with respect to said axis.

2. In an apparatus for the projection copying of an image of a mask onto a workpiece, the mask having an alignment pattern of marks at a surface thereof, said workpiece having adjustment marks on a surface thereof provided with a photosensitive layer, a beam of exposure, electromagnetic radiation passing through said mask and a projection lens along an optical axis thereof onto said workpiece, said lens being completely corrected at the wavelength of said exposure electromagnetic radiation, the improvement which comprises:

means for the adjustment exposure of the marks at one of said surfaces; and means including said lens and auxiliary optical means defining a path formed with a stigmatic defect changing an object point to a line image extending with selectively a sagittal and a meridional orientation with respect to said optical axis for projecting the adjustment-exposed marks onto a plane coplanar with the other of said surfaces for positioning of the projected images of said marks relative to the marks on said other of said surfaces, and wherein:

said marks of said surfaces include lines which extend with the same orientation pattern with respect to said optical axis.

3. In a method of projection copying of an image of a mask onto a workpiece, the mask having an alignment pattern of marks at a surface thereof, said workpiece having adjustment marks on a surface thereof provided with a photosensitive layer, a beam of exposure electromagnetic radiation passing through sad mask and a projection lens along an optical axis thereof onto said workpiece, said lens being completely corrected at the wavelength of said exposure electromagnetic radiation, the improvement which comprises:

subjecting the marks at one of said surfaces to adjustment exposure; and projecting an image of the adjustment-exposed marks through said lens and auxiliary optical means defining a path formed with a stigmatic defect changing an object point to a line image extending with selectively a sagittal and a meridional orientation with respect to said optical axis for projecting the adjustment-exposed marks onto a plane coplanar with the other of said surfaces for positioning of the projected images of said marks relative to the marks on said other of said surfaces, said marks of said surfaces including lines which extend with the same orientation pattern with respect to said optical axis.

* * * * *

Dedication 4,357,100.—*Herbert E. Mayer; Ernst W. Lobach*, both of Eschen, Liechtenstein. ARRANGEMENT FOR PROJECTION COPYING MASKS ON TO A WORK PIECE. Patent dated Nov. 2, 1982. Dedication filed Feb. 20, 1990, by the assignee, Mercotrust Aktiengesellschaft.

Hereby dedicates to the Public the remaining term of said patent.
[ *Official Gazette April 17, 1990* ]